United States Patent [19]
Parks et al.

[11] Patent Number: 5,270,571
[45] Date of Patent: Dec. 14, 1993

[54] THREE-DIMENSIONAL PACKAGE FOR SEMICONDUCTOR DEVICES

[75] Inventors: Howard L. Parks, Los Gatos; Terence D. Piatt, Pacifica, both of Calif.

[73] Assignee: Amdahl Corporation, Sunnyvale, Calif.

[21] Appl. No.: 784,894

[22] Filed: Oct. 30, 1991

[51] Int. Cl.5 .................. H01L 39/02; H01L 25/04
[52] U.S. Cl. .................. 257/686; 361/689; 361/729; 165/80.4; 165/185
[58] Field of Search .................. 257/686, 714, 726; 361/382, 393; 165/80.4, 185

[56] References Cited

U.S. PATENT DOCUMENTS

| | | | |
|---|---|---|---|
| 3,541,222 | 11/1970 | Parks et al. | 174/68.5 |
| 3,705,222 | 12/1972 | Rogers et al. | 264/45 |
| 3,705,332 | 12/1972 | Parks | 257/686 |
| 3,769,702 | 11/1973 | Scarbrough | 29/627 |
| 3,775,844 | 12/1973 | Parks | 29/626 |
| 3,813,773 | 6/1974 | Parks | 29/630 |
| 3,917,983 | 11/1975 | Kuronen | 317/101 |
| 4,095,867 | 6/1978 | Parks | 339/92 |
| 4,184,729 | 1/1980 | Parks et al. | 339/17 |
| 4,239,312 | 12/1980 | Myer et al. | 339/17 |
| 4,240,198 | 12/1980 | Alonso | 29/876 |
| 4,249,302 | 2/1981 | Crepeau | 29/830 |
| 4,268,956 | 5/1981 | Parks et al. | 29/869 |
| 4,275,410 | 6/1981 | Grinberg et al. | 357/68 |
| 4,283,754 | 8/1981 | Parks | 257/714 |
| 4,466,184 | 8/1984 | Cuneo et al. | 29/830 |
| 4,499,655 | 2/1985 | Anthony | 257/774 |
| 4,841,355 | 6/1989 | Parks | 257/686 |
| 4,939,568 | 7/1990 | Kato et al. | 257/686 |
| 4,956,746 | 9/1990 | Gates, Jr. et al. | 257/714 |
| 4,963,976 | 10/1990 | Fluegel et al. | 257/686 |
| 5,003,376 | 3/1991 | Iversen | 257/714 |
| 5,079,619 | 1/1992 | Davidson | 257/714 |
| 5,089,880 | 2/1992 | Meyer et al. | 257/700 |

Primary Examiner—Rolf Hille
Assistant Examiner—David Ostrowski
Attorney, Agent, or Firm—Fliesler, Dubb, Meyer & Lovejoy

[57] ABSTRACT

A three-dimensional microelectronic package for semiconductor chips includes alternating layers of wafer interconnect stacks and chip carrier modules. The wafer interconnect stacks provide electrical interconnections in the x, y, and z directions. The wafer interconnect stacks have conductive segments and interposers to provide signal path selection in the z-axis direction, and bump technology to provide high quality contacts between layers and continuity of the z-axis signal paths. Each layer of chip carrier modules includes a plurality of modules arranged in a preselected pattern. Each module comprises a chip carrier coupon which has a semiconductor chip mounted thereon, at least one annular spacer coupon provided on the carrier coupon and having an aperture aligned with the semiconductor chip and an opening which is aligned with a coolant discharge port in a coolant supply tube, and a lid. A coolant cavity is defined by the aperture in the spacer coupon(s). The carrier coupon, the annular space coupon and the lid all have vias for providing z axis signal transmission. Electrical interconnections between the vias on each coupon of the module and between the modules and the wafer interconnect stacks are provided by pressurizing bumps on the surface of each of these components. Coolant escapes from the coolant cavity of each module by flowing in the gaps, created by the bumps, between the carrier coupon and the spacer coupon and between the spacer coupon and the lid.

16 Claims, 9 Drawing Sheets

THREE-DIMENSIONAL PACKAGE FOR SEMICONDUCTOR DEVICES

CROSS REFERENCE TO RELATED APPLICATIONS AND PATENTS

PRESSURIZED INTERCONNECTION SYSTEM FOR SEMICONDUCTOR CHIPS, U.S. Pat. No. 5,089,880, assigned to the Assignee of the subject patent.

THREE-DIMENSIONAL MICROELECTRONIC PACKAGE FOR SEMICONDUCTOR CHIPS, U.S. Pat. No. 4,841,355, assigned to the assignee of the subject patent.

METHOD AND APPARATUS FOR FILLING HIGH DENSITY VIAS, U.S. Pat. No. 4,954,313, assigned to the assignee of the subject patent.

Each of these applications and patents are hereby incorporated by reference.

BACKGROUND OF THE INVENTION

1. Field Of The Invention

The present invention relates to packages for mounting and interconnecting semiconductor chips; more particularly, to packages for housing high speed, high power semiconductor chips in a three-dimensional array, for providing interconnections between the chips, and for dissipating the heat generated by the chips.

2. Description Of The Related Art

Many advances have been made in reducing the size of semiconductor devices, and thus in increasing the number of semiconductor devices on a chip. Accordingly, there has been an increase in the number of gates on each chip, in the number of leads (bonding pads) emanating from each chip, and in the electrical power consumed by and the heat generated by each chip. These increases in densities have required increases in the number of connections between chips, and thus larger overall packages. Dissipating the heat generated by semiconductor chips having large power handling capabilities has required larger packages. As used herein, the terms "chip", "semiconductor chip" and "semiconductor device" refer to a die having bonding pads provided thereon and which may be encapsulated in, for example, a plastic or ceramic materials with electrical interconnections between the bonding pads on the die and electrical contacts on the exterior of the capsule, and the terms "package," "microelectronic package," or "interconnect system" refer to devices for housing and/or interconnecting plural chips, semiconductor chips or semiconductor devices.

Two different types of packages have been used to provide connections between the various chips in a package, so-called "two-dimensional packages" and "three-dimensional packages." In a two-dimensional package semiconductor chips are provided on the exterior of the package and individual leads connecting the chips pass in the x, y and z directions within the package. Such a package usually comprises a plurality of wafers provided in a stack with x and y interconnects on the surface of or contained in the wafers and z direction interconnections passing through the wafers. In a three-dimensional package semiconductor chips are mounted within the package (semiconductor chips may also be provided on the exterior of a three-dimensional package) and leads passing in the x, y and z directions interconnect the various chips and provide electrical access to the chips. Accordingly, a three-dimensional package may incorporate a larger number of semiconductor chips, requiring a larger number of interconnections and greater cooling capabilities. Moreover, the interconnect system becomes more complicated because of the limited areas where x, y and z direction connections can be provided.

To determine the relative capabilities of different packages or interconnect systems several standards are utilized. The most common standard for comparing the relative capabilities of interconnect systems is the number of interconnects per unit volume of package. A similar standard is the number of pins (or leads) per unit volume of package. Other methods of comparison include computing the package volume per chip and the number of gates per unit volume of package.

Examples of three-dimensional packages are disclosed in U.S. Pat. No. 3,769,702 and U.S. Pat. No. 4,841,355, and an example of a two-dimensional package is illustrated in U.S. Pat. No. 3,705,332. Other U.S. patents pertaining to packages for semiconductor chips include the following: U.S. Pat. No. 3,775,844; U.S. Pat. No. 3,813,773; U.S. Pat. No. 3,917,983; U.S. Pat. No. 4,095,867; U.S. Pat. No. 4,268,956; and U.S. Pat. No. 4,283,754. The two and three-dimensional packages and interconnect systems illustrated in U.S. Pat. Nos. 3,705,332 and 3,769,702 utilize 50 mil. grids for the z-axis connections and have a pin density of approximately 940 pins per cubic inch. Z-axis connections in two- and three-dimensional packages may be provided by "button interconnects," as disclosed in U.S. Pat. No. 3,541,222, U.S. Pat. No. 3,705,222, U.S. Pat. No. 3,775,844, and U.S. Pat. No. 4,268,956, all assigned to the assignee of the present invention.

Examples of Conventional Packaging Systems

U.S. Pat. No. 4,095,867 describes a pressurized interconnection scheme which use substantially metallic wafers suitable for assembling a pair of flat-pack devices with a pressure cap.

U.S. Pat. No. 4,184,729 describes a pressurized structure for creating an electrical contact between a flexible cable and two planar circuit boards or a single planar circuit board by applying pressure.

An alternative to the conventional drill-and-plate technology for forming surface-to-surface connections in a wafer was described in U.S. Pat. No. 4,239,312, and in U.S. Pat. No. 4,275,410. Conductive pathways were formed through ceramic materials by generating a thermal gradient through the ceramic material and causing a droplet of liquid aluminum to migrate along the gradient, leaving a conductive pathway in its wake. Electrical connections between layers were accomplished by spring-loaded conductors which elastically deformed under mechanical load. This concept uses materials having high dielectric constants and materials having a large resistance, e.g., aluminum, and is limited in density of layer-to-layer interconnections by the use of the spring-loaded conductors.

U.S. Pat. No. 4,240,198 describes the use of a conductive elastomer in the formation of electrical connections through a layer composed of metal. The intended application of the disclosed structure was in high-density connectors.

U.S. Pat. No. 4,499,655 describes the formation of a segment in a silicon-on-sapphire composite substrate which has solder as its major constituent. The solder segments in one layer are coarsely aligned with solder segments in adjacent layers, and the assembly is then fused together at high temperature to achieve precise alignment of the layers. Clearly, pulse propagation velocity was not a consideration in this design.

A pressurized system for electrically connecting two surfaces of adjacent elements is described in U.S. Pat. No. 4,466,184. The structure disclosed makes no provision for electrically interconnecting conductors on opposed surfaces of the same layer (wafer). Further, the inter-layer contact system must be formed separately from stock metal and then mechanically inserted between the surfaces to be connected.

U.S. Pat. No. 4,249,302 discloses a multi-layer printed circuit board having a pattern of pads formed in each layer. Pads on adjacent layers are brought into contact by pressure. The substrate for each layer may be a low dielectric material such as Teflon.

U.S. Pat. No. 4,841,355 discloses a three-dimensional microelectronic package for semiconductor chips, comprising a plurality of cavity wafers arranged in a stack, each cavity wafer having a plurality of cavities, tunnels for providing private coolant to said cavities, and conductive paths, and a plurality of interconnect means, attached to the cavity wafers at positions corresponding to the positions of the cavities, for housing the semiconductor chips, electrically interconnecting the semiconductor chips and the conductive paths of said cavity wafers, selectively electrically interconnecting the conductive paths of adjacent cavity wafers, and for providing a medium for exchanging heat between the semiconductor chips and the coolant in the cavities.

Cooling the semiconductor chips sandwiched between wafers within a package becomes critical in three-dimensional packages. The factors to be considered in comparing the cooling needs and capabilities of various packages include the number of watts generated by each chip, the number of watts generated by the total number of chips, the flow rate of coolant for each chip and for the package, and the thermal or temperature differential between the various semiconductor chips in the package.

Problems with prior packages include the large size and weight of the packages and the computers incorporating such packages—conventional CPU weights approach 0.6 pounds per LSI chip, and providing the same coolant to cool more than one chip serially. The coolant is warmed by each successive chip which it passes over and the ability of the coolant to dissipate heat diminishes for each successive chip. The last chip to receive the coolant will have a higher operating temperature than the first chip to receive the coolant. Such a temperature differential is detrimental to the operation of the overall system including the chips in question.

Further, it is desirable to provide interconnect mechanism microelectronic packages which offer: (1) a substantial increase in number of conductive layers; (2) electrical interconnection among several layers which is independent of the thickness of the assembly; (3) convenient repair and revision capability; (4) higher signal propagation velocities; and (5) greater control over signal routing.

SUMMARY OF THE INVENTION

It is, therefore, an object of the present invention to provide a three-dimensional package for semiconductor chips providing an increased interconnection density and enhanced chip cooling capabilities.

A further object of the present invention is to provide a three-dimensional package which uses a building block approach to package design.

A further object of the present invention is to provide a three-dimensional package having cooling tubes which perform the combined functions of package alignment and coolant supply. A further object of the present invention is to provide a three-dimensional package having a reduced package volume and which has a simplified manufacturing process.

A further object of the present invention is to provide a three-dimensional package having a reduced average chip pitch.

A further object of the present invention is to provide a three-dimensional package having a reduced mechanical complexity, and thus is easier to assemble and disassemble for both initial assembly and engineering changes.

These and other objects of the present invention are provided by a three-dimensional package which has alternating layers of wafer interconnect stacks and chip carrier modules. The wafer interconnect stacks provide electrical interconnections in the x, y, and z directions. The structure of the wafer interconnect stacks employ insulating layers having the largest possible dielectric constant to increase signal propagation velocities, conductive segments and interposers to provide signal path selection in the z-axis direction, and bump technology to provide high quality contacts between layers and continuity of the z-axis signal paths.

Each layer of chip carrier modules include a plurality of modules arranged in a preselected pattern. Each module comprises a carrier coupon which has a semiconductor chip mounted thereon, at least one annular spacer coupon provided on the carrier coupon and having an aperture aligned with the semiconductor chip and an opening which is aligned with a coolant discharge port in a coolant supply tube, and a cover coupon (lid). A coolant cavity is defined by the aperture in the spacer coupon(s). The carrier coupon, the annular spacer coupon and the lid all have vias for providing z axis signal transmission. Electrical interconnections between the vias on each coupon of the module and between the modules and the wafer interconnect stacks are provided by pressurizing bumps on the surface of each of these components. Coolant escapes from the coolant cavity of each module by flowing in the gaps, created by the bumps, between the carrier coupon and the spacer coupon and between the space coupon and the lid.

The coolant supply tubes extend through the package in the z-axis directions in alignment holes provided in the wafer interconnect stacks. The coolant tubes perform the combined function of coolant supply, module alignment, and package alignment.

The use of parallel liquid cooling improves cooling capability over conventional packages while requiring less space, therefore increasing packaging density over conventional packages. The use of flexible wafer interconnect stacks between each layer of modules allows communication in the X-Y direction between the Z-axis vias while eliminating the need for large ceramic pieces. The package utilizes pressure interconnect buttons to complete communication in the Z direction. This package design incorporates a building-block approach which aids assembly and disassembly and reduces the number of components to simplify manufacturing.

By way of example, a three-dimensional package in accordance with the present invention housing 144 chips has a volume of approximately 247 cm$^3$. The chips could have on the order of 12,000 gates per chip; a total 1.73 million gates. The chips may be organized, for example, in nine layers of 16 chips, each group of 16 chips being oriented in a 4×4 array. The volume per chip for the package of the present invention is approximately 1.7 cm$^3$ per chip. A package in accordance with the present invention achieves a temperature differential of approximately 5° C. or less for all chips in the package. Each chip has a power of approximately 39 watts, and thus the cooling capability of the three-dimensional package of the present invention is 5,600 watts using a flow rate of 8 gallons per minute for the system or 0.05 gallons per minute per chip.

A package for a plurality of electrical devices, comprising: a group of alternating layers of wafer interconnect stacks and chip carrier modules, said layers of wafer interconnect stacks and chip carrier modules being substantially orthogonal to the z-axis, each said wafer interconnect stack having alignment holes, z-axis vias, and x-y traces electrically connecting selected z-axis vias, and each said chip carrier module having a coolant cavity, housing a respective one of the electrical devices in an environment isolated from and in thermal contact with the coolant cavity, and providing electrical interconnections between the electrical devices and said z-axis vias of said wafer interconnect stacks; a plurality of coolant supply tubes extending through the alignment holes in said wafer interconnect stacks and arranged in an array so that said coolant tubes position each said chip carrier module and provide private coolant to said chip carrier modules.

DESCRIPTION OF THE PREFERRED EMBODIMENTS

A three-dimensional microelectronic package for semiconductor chips in accordance with the preferred embodiments of the present invention will be described with reference to FIGS. 1–11.

Figure 1:
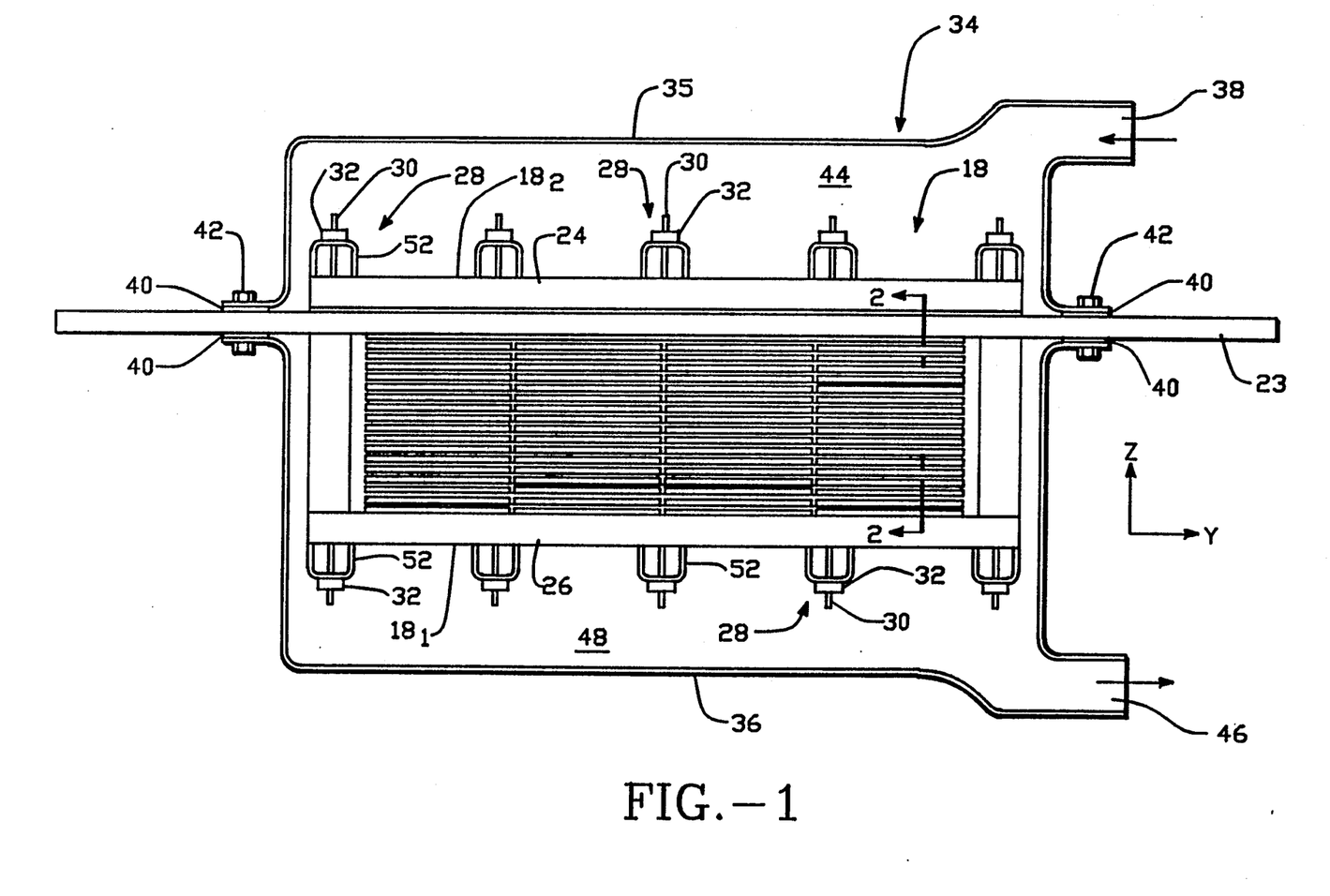
FIG. 1 is a partial cutaway, side view of a three-dimensional microelectronic package according to the present invention.
Figure 2:
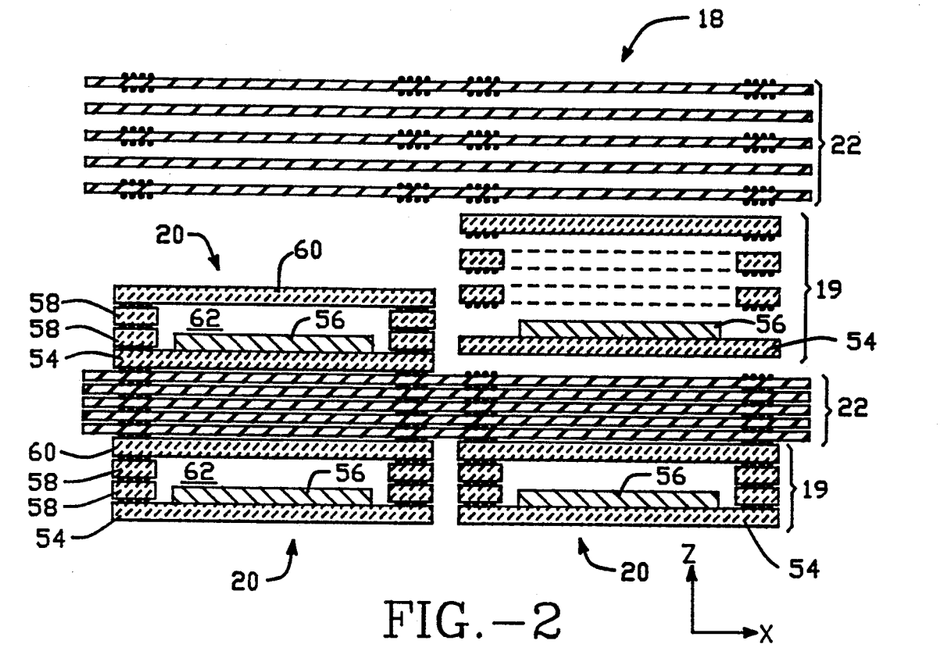
FIG. 2 is a sectional view of a three-dimensional microelectronic package along line 2—2 in FIG. 1.
Figure 3:
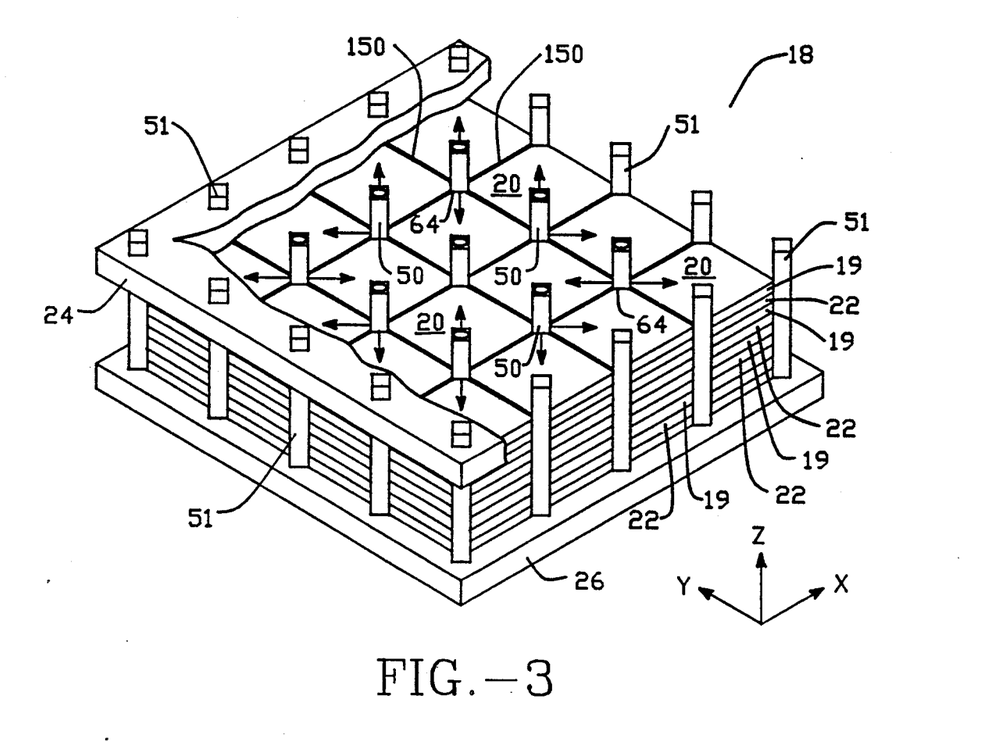
FIG. 3 is a partial cutaway perspective view of a of a three-dimensional microelectronic package according to the present invention.
Figure 4A:
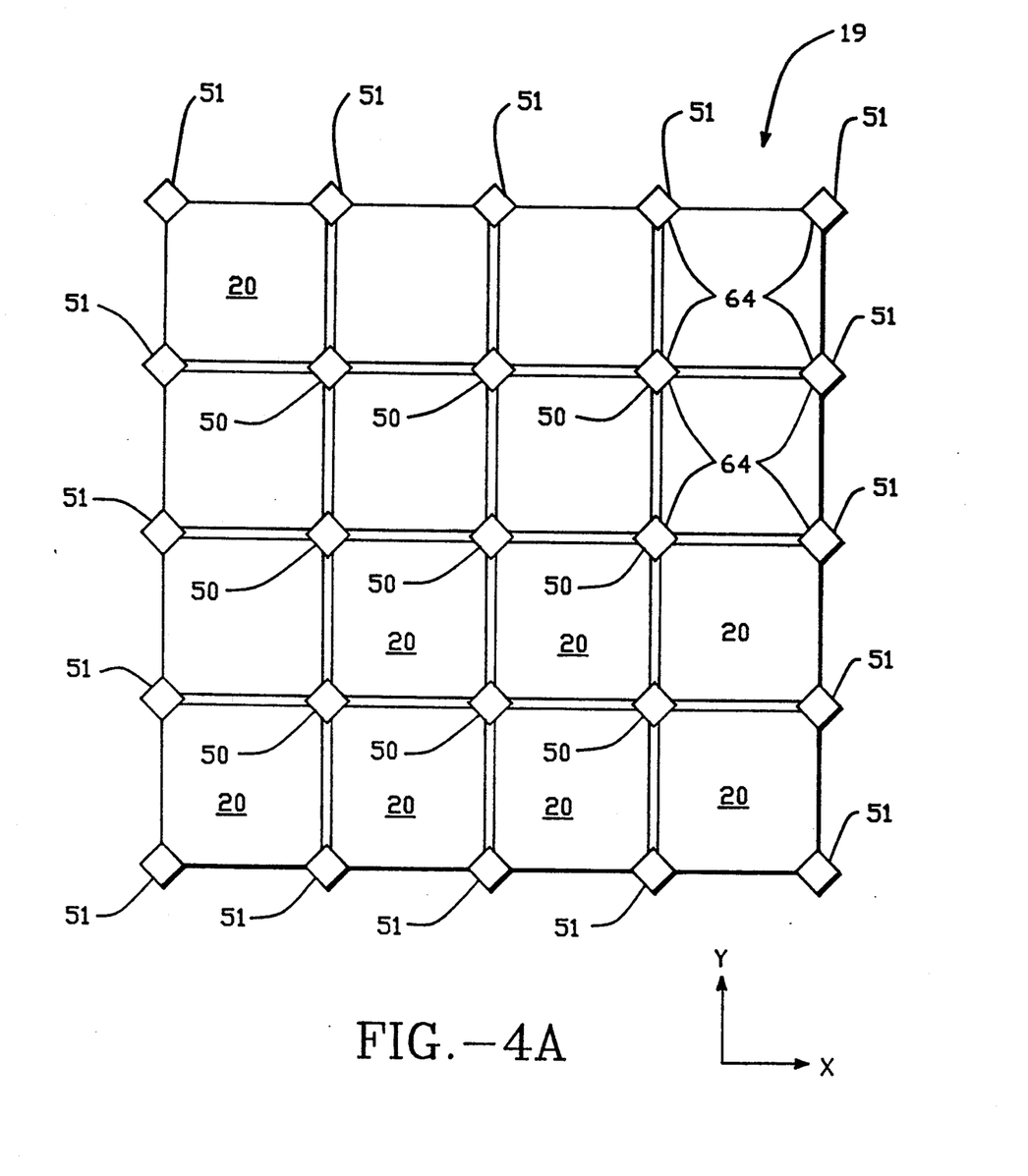
FIG. 4A is a plan view of a group of chip carrier modules and coolant tubes forming a layer of a three-dimensional microelectronic package according to the present invention.
Figure 4B:
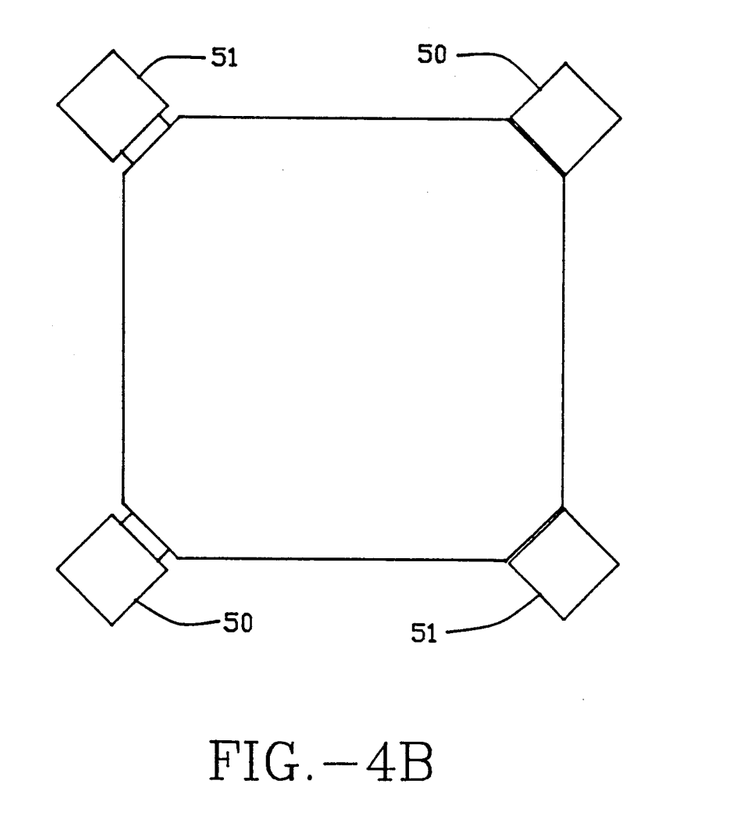
FIG. 4B is an enlarged plan view of a chip carrier module and four coolant tubes shown in FIG. 4A.
Figure 5:
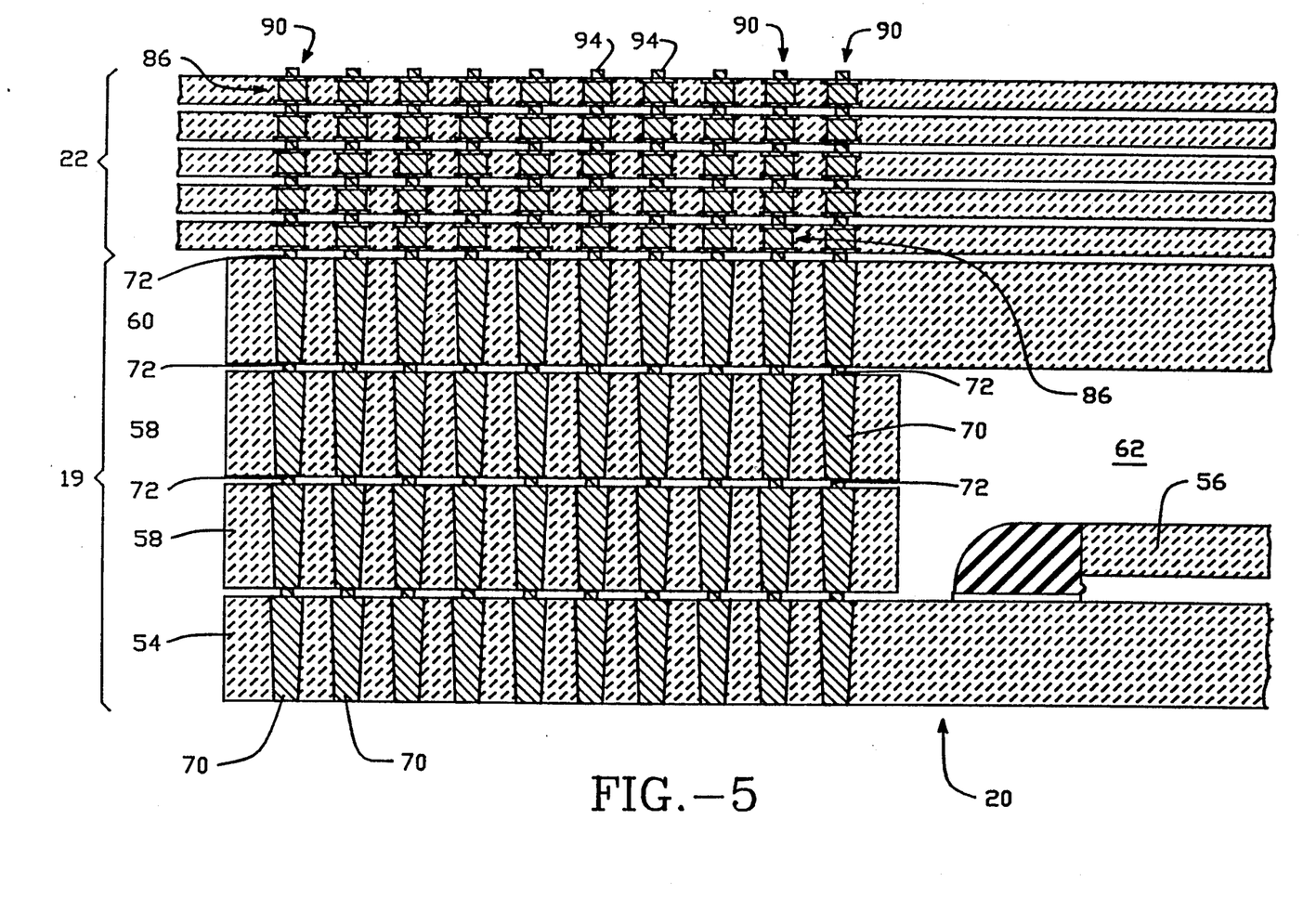
FIG. 5 is a partial, sectional view of a chip coupon and a wafer interconnect stack utilized in a three-dimensional microelectronic package according to the present invention.

With reference to FIGS. 1–5, a three-dimensional microelectronic package 18 according to the present invention includes alternating chip carrier layers 19 (each chip carrier layer 19 including an array of chip carrier modules 20) and wafer interconnect stacks 22, and at least one power and signal I/O board 23, as shown in FIG. 1 (in the embodiment shown in FIG. 5, two I/O boards 23 are provided). In the embodiment described herein each chip carrier layer 19 includes a 4×4 array of chip carrier modules 20; however, other size arrays can be provided using the building block approach provided by the array structure. Top and bottom pressure plates 24, 26 and fasteners 28 pressurize chip carrier modules 20 and wafer interconnect stacks 22 along the Z-axis. Fasteners 28 may be, for example, wire loading springs 30 and wire crimps 32. Package 18 may be provided in a sealed housing 34 having a housing top 35 and a housing bottom 36. Housing top 35 has a coolant inlet 38 and is sealed to I/O board 23 by gasket seals 40 and fasteners 42, thereby defining an upper coolant chamber 44. Housing bottom 36 has a coolant outlet 46 and is also sealed to I/O board 23 by gasket seals 40 and fasteners 42 to establish a lower coolant chamber 48.

Coolant tubes 50 are open to the chamber 44 and transfer coolant into package 18 from coolant chamber 44 and coolant tubes 51 are open to chamber 48 and transfer coolant from package 8 to chamber 48. Tubes 50, 51 have a square cross-section which is useful for aligning wafer interconnect stacks 22 and chip carrier modules 20. Other cross-sectional shapes of tubes 50, 51 may be used provided that modules 20 have a matching configuration. In addition, coolant tubes 50, 51 form passages in microstack 18 through which wire loading springs 30 pass from top 18$_1$ to bottom 18$_2$ of the package 18. Coolant port bridges 52 space wire crimps 32 away from the pressure plates 24, 26 so that wire crimps 32 do not block the flow of coolant into or out of coolant tubes 50, 51.

Chip Carrier Modules

Chip carrier module 20 will be described with reference to FIGS. 2, and 4-8. Each module 20 includes a chip carrier coupon 54 having a chip 56 bonded thereto. As discussed below, chips 56 are hermetically sealed. One or two spacer coupons 58, which are cut out in the middle to clear the chip 56 and which have a slot 57 in one corner for coolant flow, are placed on coupon 54. Coupon 60 functions as a lid. The coupons 54, 58, 60 define a coolant cavity 62. In one embodiment, coupons 54, 58, 60 are 21 mm square and 0.5 mm thick and house chips 56 having dimensions of approximately 13 mm × 13 mm and a thickness of 0.5 mm. Utilizing spacer coupons 58 having a 15.5 mm opening, the volume of each cooling cavity 62 may range from approximately 0.182 cc to 0.331 cc depending on the height of bumps 72 (0.035 mm to 0.075 mm).

Each coupon 54, 56, 60 has precision ground chamfered corners 64 for alignment against the coolant tubes 50, 51.

Coupons 54, 58, 60 have electrical through vias 70 (FIG. 5). Vias 70 are terminated by buttons 72, at one or both ends of each via 70. A via 70 and a button 72 of respective coupons 54, 58, 60 or two buttons 72 are forced into electrical contact by pressurizing the package with fasteners 28. Chip carrier coupons 54 include wirings 120, 132, e.g., thin film surface traces (FIGS. 7A, 7B, 8A, 8B), to connect chip 56 with vias 70.

Wafer Interconnect Stacks

A wafer interconnect stack 22 (alternately termed a "microstack") is a pressurized system for interconnecting electrical devices, where a plurality of signal wafers 80 and ground wafers 82 are assembled into a stack 22 and pressurized to establish electrical interconnections between the wafers 80, 82. Each signal wafer 80 has a desired pattern of conductors 106 to provide interconnections in the x and y directions and segments 86 in each wafer 80, 82 are connected under pressure to provide the wafer-to-wafer (z-axis) electrical interconnections. Each layer is fabricated using, for example, a low-dielectric-constant polymer.

Wafer interconnect stacks 22 are discussed in copending application entitled PRESSURIZED INTERCONNECTION SYSTEM FOR SEMICONDUCTOR CHIPS, SC/Ser. No. 07/362,822, filed Jun. 7, 1989, which is incorporated herein by reference. For completeness, a discussion of some of the features of wafer interconnect stacks 22 are set forth below with reference to FIG. 9. Each wafer 80, 82 has a plurality of segments 86 provided in an array so that aligned segments 86 in wafers 80, 82 form columns 90. Each column 90 is made conductive by the application of pressure along the z-axis of the wafer interconnect stack 22. Selected ones of the columns 90 are aligned with and electrically connected to vias 70 of wafers 54, 60.

Figure 9:
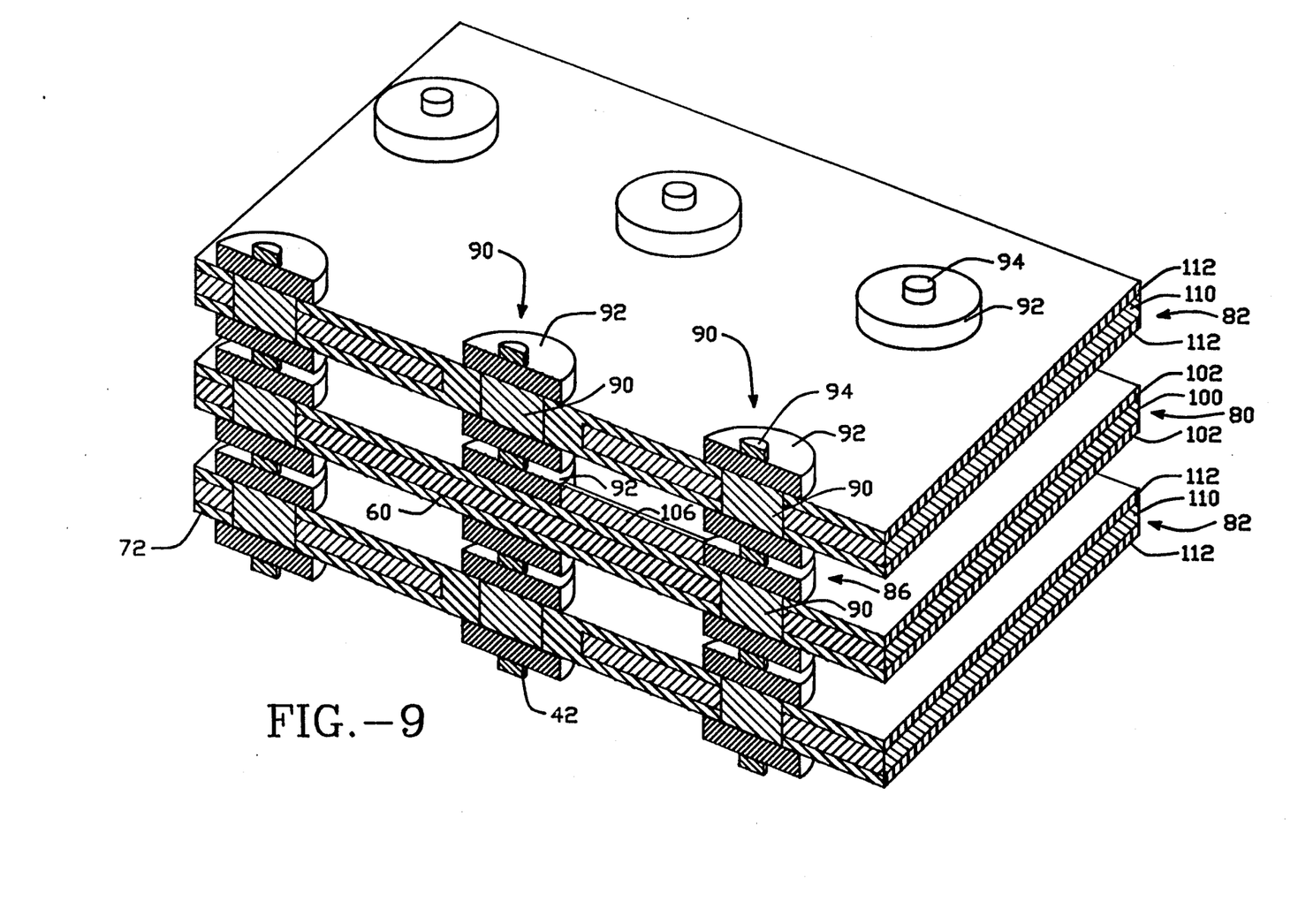
FIG. 9 is a partial, sectional view of a second embodiment of a wafer interconnect stack utilized in a three-dimensional microelectronic package according to the present invention.
Figure 10A:
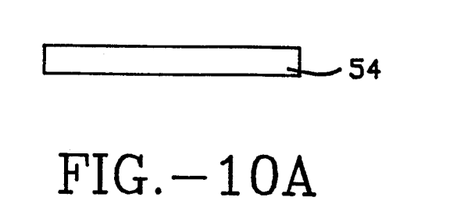
FIGS. 10A–E and 11A–D are sectional views useful in describing a process for sealing a semiconductor chip to a chip carrier coupon.
Figure 10B:
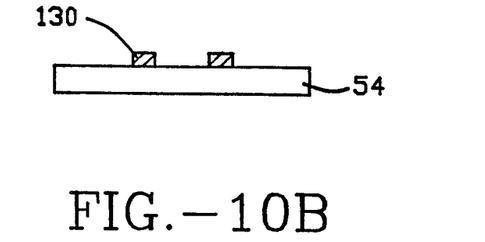
Figure 10C:
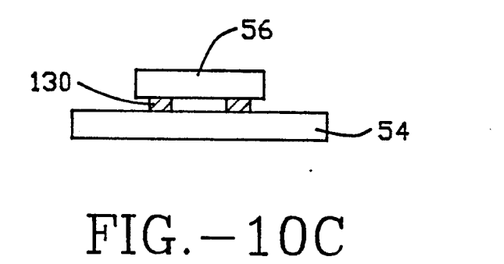
Figure 10D:
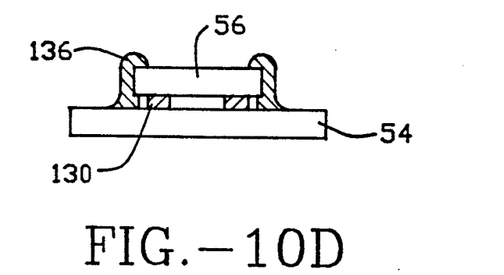
Figure 10E:
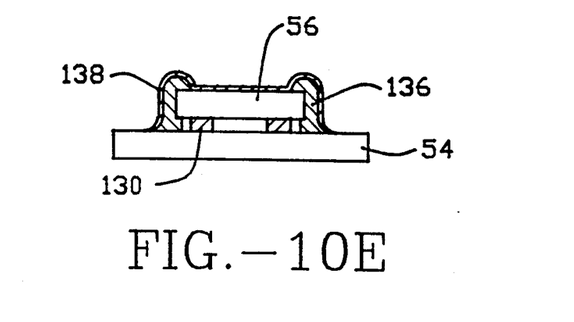
Figure 11A:
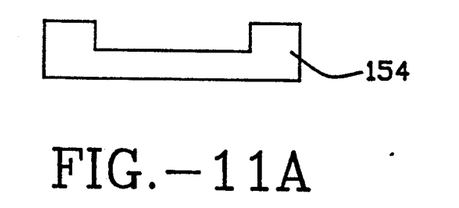
Figure 11B:
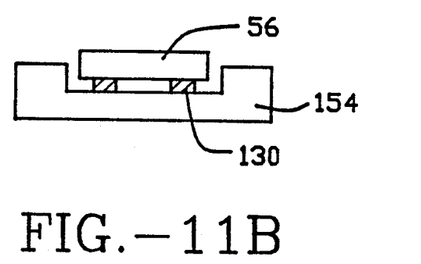
Figure 11C:
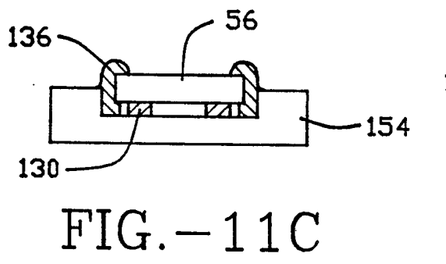
Figure 11D:
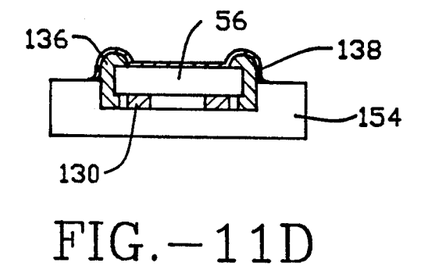

In the embodiment illustrated in FIG. 9, each segment 86 includes a via 90 and pads 92 provided at each end of via 90. An inter-wafer contact (or bump) 94 is provided between pads 92 of segments 86 on adjacent wafers 80, 82. Bumps 94 may be provided only at one end of each segment 86, with the bumps 94 on the segments in one layer 86, 82 contacting the bumpless end of segment 86 in an adjacent layer 80, 82. In the preferred embodiment, the layers 82 have bumps 94 provided at both ends of segments 86. The contact between a chip carrier module 20 and a wafer interconnect stack 22 is a bump-to-segment contact. Two options are contemplated: the segments 86 at the bottom of a wafer interconnect stack 22 may be formed without bumps so that bumps 72 on vias 70 of wafer 60 contact segments 86 at the bottom of wafer interconnect stack 22; or bumps 94 may be provided on the segments 86 at the bottom of wafer interconnect stack 22 and vias 70 of wafer 60 may be formed without bumps, providing a via-to-bump contact.

Bumps 94 are designed to deform under pressure. This deformation, which causes bumps 94 to assume a "barrel-like" shape, assures that all columns 90 will have substantially equal lengths, thereby avoiding open circuits which could be caused by air gaps between bumps 94 (or between a bump 94 and a segment 86) if one segment 86 or bump 94 were longer than another segment 86 or bump 94 on a wafer. Further, bumps 94 may be formed of a material, e.g., gold or a gold alloy, which is more malleable than the material used to form segments 86 to assure that bumps 94 rather than segments 86 will deform under pressure. Another purpose of bump deformation is to provide an increased contact surface area as the bumps 94 "flow" under pressure.

Wafer interconnect stack 22 combines layers which have a small dielectric constant and a high time-dependent deformation factor with conductive segments having a low time-dependent deformation factor to provide a structure in which the segments are pressurized and bear the mechanical load of pressurization so that the wafer interconnect stack 22 does not creep.

One example of a low dielectric constant, low time-dependent deformation factor structure is a signal wafer 80 which includes a core 100 and at least one dielectric layer 102 provided on core 100; alternatively, dielectric layers 102 may be provided on both surfaces of core 100. Core 100 is formed of a material, e.g., a polyamide such as Kapton, which provides a semi-rigid structure. Polyimides are a class of plastics which are resistant to high temperature, wear, radiation, and many chemicals. Dielectric layers 102 are formed of the lowest dielectric constant material practical, for example, a PTFE such as Teflon. Segments 86 extend through the signal wafer 80 and signal traces 106 formed on dielectric layer 102 provide electrical interconnections between selected columns 90.

Ground wafers 82 may include a conductive core 110 and an insulating or dielectric layers 112. Core 110 may be formed of copper or other conductors such as aluminum or gold or compounds of these materials, and dielectric layer 112 may be formed of a polyamide such as Kapton. The core 110 may be maintained at ground potential or at a selected voltage. Moreover, the cores, 110 of different ground layers 82 may be maintained at different voltages. Core 110 is electrically interconnected with selected columns 90 through contact with segments 86 in the selected column. By providing ground or voltage planes, i.e., cores 110, on each side of a signal wafer 80, interference between the signals traveling in signal traces 106 on respective signal wafers 80 is avoided.

Chip Sealing

The sealing of chips 56 to coupon 54 will be discussed with reference to FIGS. 7A, 7B, 8A, 8B–10A–E, and 11A–D. Chips 56 are electrically bonded to coupon 54 using, for example, tape-automated bonding (TAB) or C4 bonding techniques. In this embodiment, chips 56 are not packaged in plastic or ceramic packages such as DIPs, pLCCs, and thus must be sealed. Although not required, it is probable that a hermetic seal is desirable for reliability. One type of hermetic seal is shown in FIGS. 7A and 7B and another type of hermetic seal is shown in FIG. 8A.

Figures 7A, 7B:
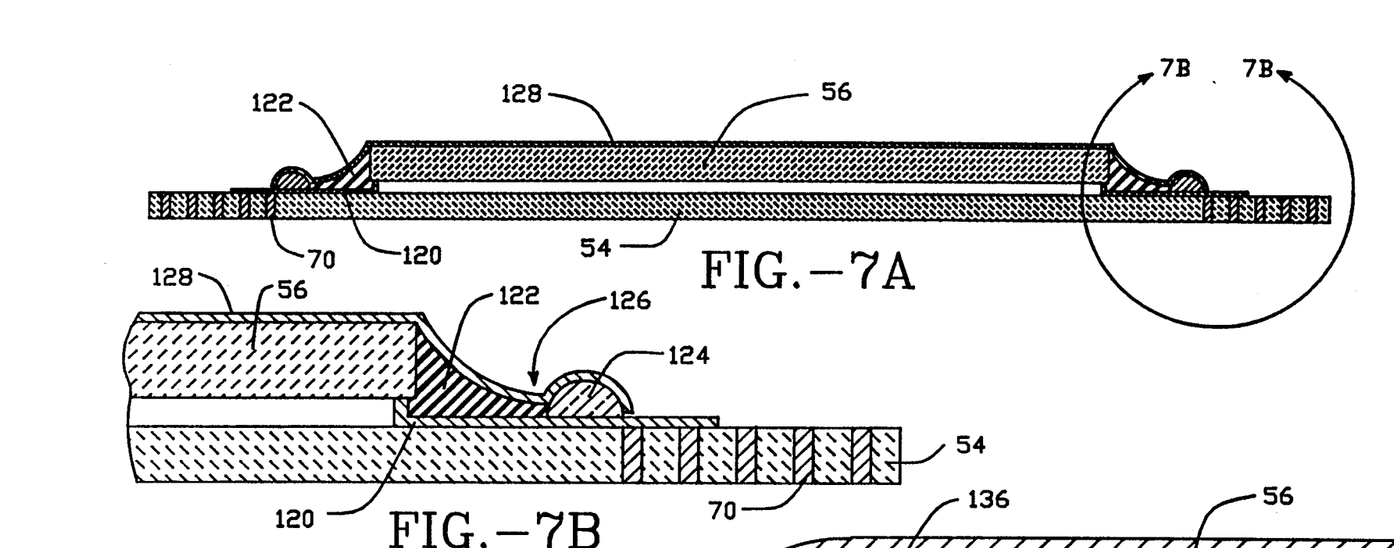
FIG. 7A is a partial, sectional view of first embodiment of a chip coupon utilized in a three-dimensional microelectronic package according to the present invention.
FIG. 7B is a partial, sectional view along line 7B—7B in FIG. 7A.

With respect to FIGS. 7A and 7B, chip 56 is supported by and electrically connected to wirings 120. Wirings 120 provide connections between the chip 56 and vias 70 in coupon 54. A filet 122 of a dielectric, for example, a polyamide such as Kapton or Siloxane, is provided around the periphery of chip 56, and a glass bead 124 is formed at the outer edge 126 of the polyamide filet 122. A single or multiple layer metal coating 128 serves as a seal and to spread the heat generated by chip 56. The metal coating may be applied by, for example, sputtering. The polyamide 122 and metal 128 function to seal chip 56 to the coupon 54 while allowing metal traces of wirings 120 to penetrate the seal.

Figure 8A:
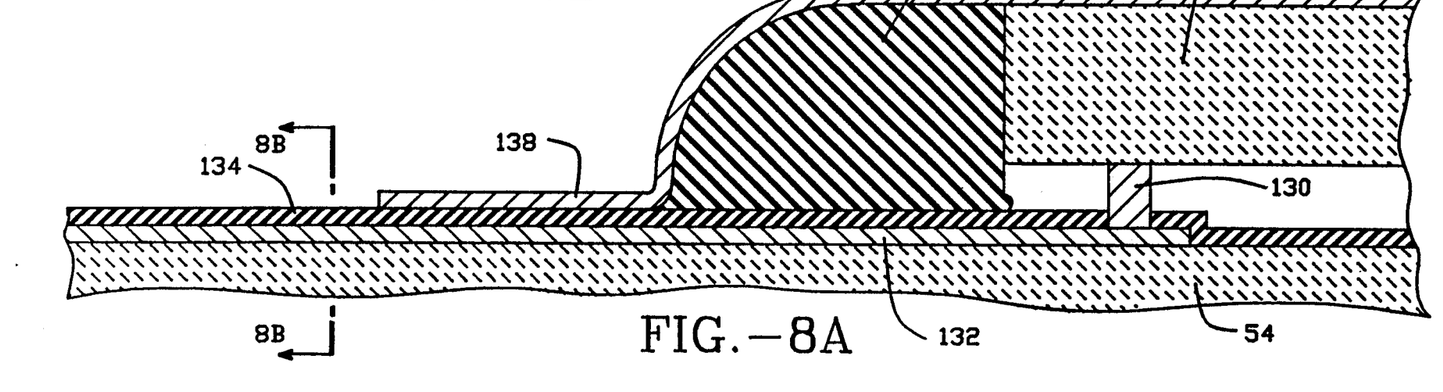
FIG. 8A is a partial, sectional view of a second embodiment of a chip coupon utilized in a three-dimensional microelectronic package according to the present invention.
Figure 8B:
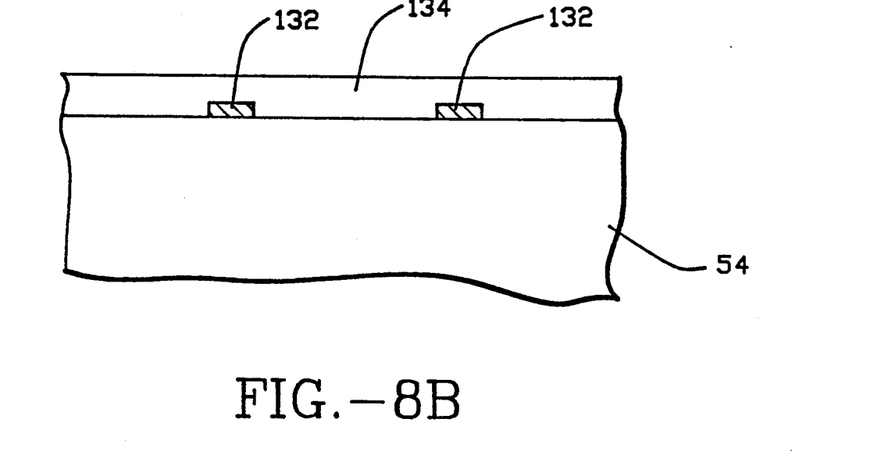
FIG. 8B is a partial sectional view along line 8B—8B in FIG. 8A.

With respect to FIG. 8A, chip 56 is supported by and bonded to bump contacts 130 for TAB or $C^4$ bonding. Bump contacts 130 are connected to wirings 132 which provide electrical connections between chip 56 and vias 70 (not shown in FIG. 8). Wirings 32 may be multi-layer structures which are fabricated with layers including a sputtered Cr adhesive layer, a sputtered Cu plating layer, a plated Cu low resistance conductor layer, a plated Ni diffusion barrier layer, and a plated Au corrosion resistant layer. A dielectric layer 134, formed of, for example, silicon oxynitride, provides a hermetic seal for wirings 120, 132 (see FIG. 8B). The periphery of chip 56 has a moisture seal 136 formed of a polyamide, and a Cr/Cu/Cr passivation and heat spreading layer 138 overlies dielectric layer 134, and moisture seal 136.

The chip seal utilized in the package of the present invention provides the following features: a low profile to reduce package volume; a short thermal path having a large area to increase heat transfer; and the option of utilizing metal layer 128 or 138 as an electrical connection between the chip 56 and the chip carrier coupon 54 (this connection could be used as a ground or to provide a substrate voltage to the chip).

The process for sealing a chip 56 to a chip carrier coupon 54 or a recessed chip carrier coupon 154 will be described with reference to FIGS. 10 and 11. The first step is to provide bump contacts 130 on coupon 54 or coupon 154, and the second step is to bond the chip 56 to bump contacts 130. Then, a moisture seal 136 is formed at the periphery of the chip 56, sealing the edges of chip 156 to coupon 54 or coupon 154. Moisture seal 136 is a solution of pre-imidized polyamide with a siloxane backbone in diglyme solvent. This mixture has excellent dielectric properties, low moisture absorption and good adhesion characteristics. Then, a metal layer (or layers) 138 is applied over the coupon (54 or 154), the moisture seal 136, and the top surface of chip 56. In the preferred embodiment, metal layers 138 are a sputtered thin film composite of Cr/Cu/Cr, in which the first Cr layer functions as an adhesive layer, the Cu film functions as a passivation layer and a heat spreader, and the top Cr layer functions to protect against Cu oxidation and metal erosion which may be caused by the coolant.

Cooling

Figure 6:
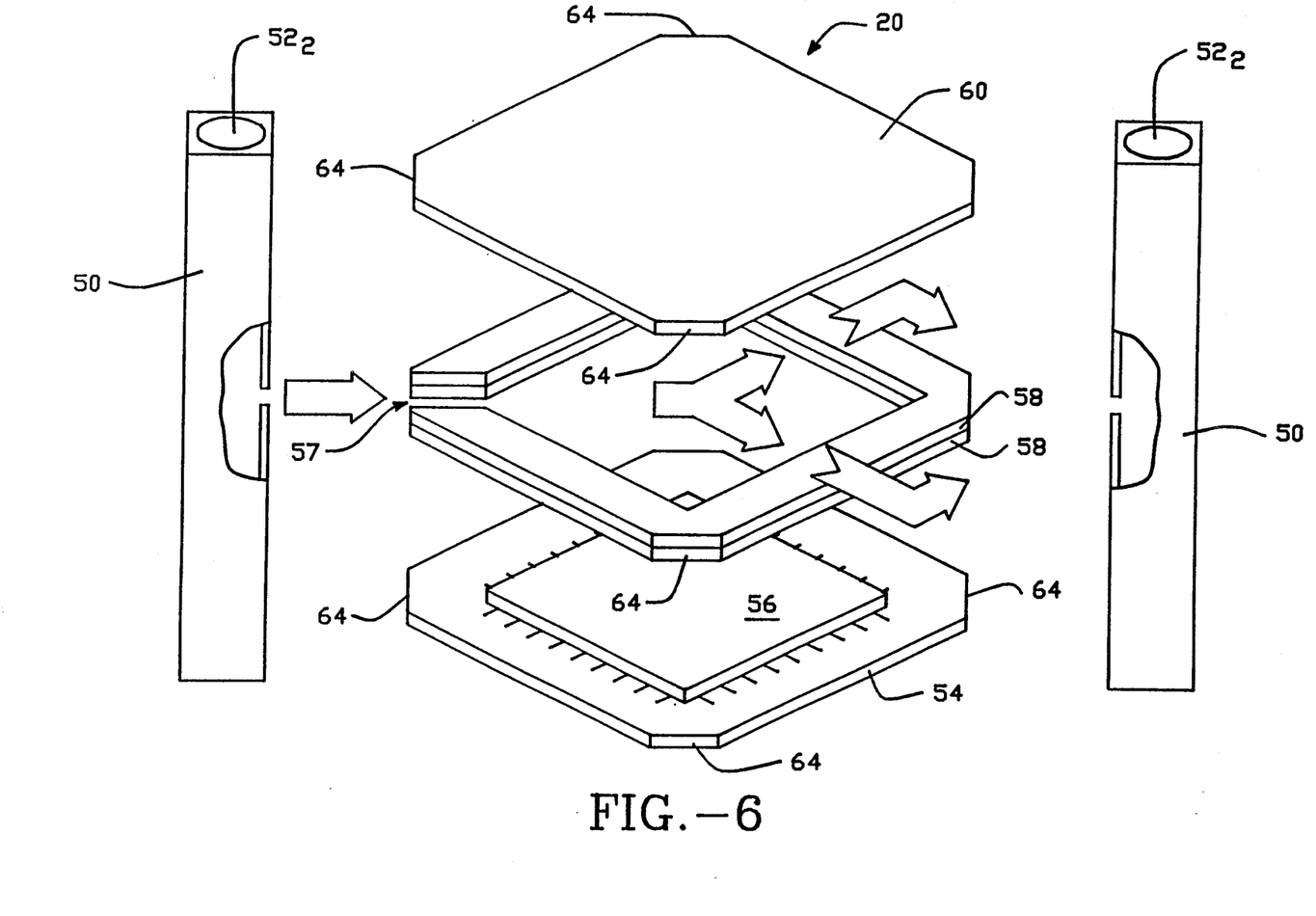
FIG. 6 is an exploded, perspective view of a chip coupon and two cooling tubes useful in describing the coolant flow through a chip carrier coupon.

Coolant flow will be described with reference to FIGS. 1 and 6. Coolant is provided to chamber 44 through inlet 38, and then enters coolant tubes 50. The coolant may be pressurized or may flow through force of gravity. In either case, coolant in the chamber 44, which is sealed from chamber 48 with the exception of the passages provided by coolant tubes 50, flows into the coolant tubes.

Each chip carrier module 20 is considered as a cell which is fed coolant from an opening $50_1$ in a coolant tube 50 through slot 57. The coolant enters the cavity 62 through the square channel formed by the corner slots 51 in the two spacer coupons 58.. The heated coolant exits the cavity by flowing between the coupons 54, 58, 60 through the spaces created by bumps 72. From there, the coolant along alleys 150 in the X and Y directions until it exits from sides of the package 18. Alternatively, the coolant may drop through gaps between the round clearance holes in the wafer interconnect stacks 22 and square coolant tubes 50. In another alternative, selected coolant tubes 50 may be closed to chamber 44 and thus function as coolant removal paths.

Each coolant tube 50 may provide coolant to one or more chip carrier modules 20 per layer and to chip carrier modules 20 in several layers 19. However, each chip carrier module 20 receives private coolant, i.e., coolant which has not been previously used to cool a chip 56 in another module 20. Thus, the coolant is provided to all modules 20 in parallel rather than in series. To assure that all of the chip carrier modules 20 receive the same amount of coolant, the cross-sectional area of the coolant passage $50_2$ (FIG. 6) of each coolant tube 50 is equal to or greater than the total cross-sectional area of the slots 57 of the chip carrier modules 20 to which the coolant tube provides coolant.

Experimental results have shown that higher coolant velocities across the heat exchanger 128, 138, which is in contact with chip 56, provide increased cooling. Higher average coolant velocities may be provided by smaller coupon-to-coupon spacings. In particular, average coolant velocities of 3.87 feet/second have been calculated for a coolant cavity 62 volume of 0.182 cc and 0.035 mm spacings between coupons 54, 58, 60. It has been determined that the velocity of the coolant and not the volume of the cavity 62 is determinative of the heat transfer rate.

The coolant used with the package of the present invention is a non-conductive coolant, for example, a Fluorinert liquid. The best experimental cooling results have been achieved with the coolant having the lowest boiling point. Thus, Fluorinert FC-72 (boiling point 56° C.) provided better results than Fluorinert FC-84 (boiling point 80° C.) and Fluorinert FC-77 (boiling point 97° C.). It is known that when the surface temperature of the structure being cooled (heat spreading layers 128, 138) exceeds the boiling point of the Fluorinert liquid by about 8° C., the nucleate boiling region is entered. In the nucleate boiling region, vapor bubbles begin to form at specific nucleation sites on the surface being cooled. The formation and release of these vapor bubbles disrupts the stagnant liquid film at the surface and dramatically increases the heat transfer coefficient. A higher coolant velocity serves to cause a more rapid removal of the vapor bubbles, and thus better heat transfer.

One example of the package described has 144 chips (nine layers 19 of sixteen chip carrier modules 20) with 400 I/O per chip combined with approximately 1400 through vias in each chip carrier module 20. Cooling studies have proven the feasibility of removing up to 50 watts per 13 mm square chip using this configuration. This equals to 6210 watts in a package 18 having total volume of less than 165 cubic centimeters (10 cubic inches).

The many features and advantages of the three-dimensional package of the present invention will be apparent to those skilled in the art from the description of the preferred embodiment. Thus, the following claims are intended to cover all modifications and equivalents falling within the scope of the invention.

We claim:

1. A package for a plurality of electrical devices, comprising:
    a group of alternating layers of wafer interconnect stacks and chip carrier modules, each said layer of chip carrier modules including a plurality of individual chip carrier modules arranged in a grid array with one chip carrier module in each grid array location, each said wafer interconnect stack having alignment holes, vias, and traces electrically connecting selected vias, and each said chip carrier module having a coolant cavity, housing a respective one of the electrical devices in an environment isolated from and in thermal contact with the coolant cavity, and providing electrical interconnections between the electrical devices and said vias of said wafer interconnect stacks; and a plurality of coolant supply tubes extending through the alignment holes in said wafer interconnect stacks and arranged in an array so that said coolant tubes position each said chip carrier module and provide private coolant to said chip carrier modules.

2. A package for a plurality of electrical devices according to claim 1, further comprising means for compressing said group of alternating layers of wafer interconnect stacks and chip carrier modules in a direction substantially orthogonal to the planes of said alternating layers.

3. A package for a plurality of electrical devices according to claim 1, wherein:

each said chip carrier module has a coolant inlet having an area; and each said coolant tube has a cross-sectional area greater than the total area of the coolant inlets of said chip carrier modules supplied with coolant by the corresponding, respective coolant tube.

4. A three-dimensional microelectronic package for semiconductor chips, comprising:

a plurality of wafer interconnect stacks, a selected one of said wafer interconnect stacks defining the x-y plane of a three-dimensional coordinate system, each wafer interconnect stack having conductive segments and alignment holes extending in the direction of the z-axis of said three-dimensional coordinate system;

a plurality of chip carrier modules organized in groups, each group of chip carrier modules being arranged in alternating layers with said plurality of wafer interconnect stacks, each chip carrier module having a coolant cavity and a coolant inlet for supplying coolant to said coolant cavity, housing a semiconductor chip in thermal contact with said coolant cavity, and providing electrical interconnections between the semiconductor chip and said conductive segments of said wafer interconnect stacks;

a plurality of coolant tubes inserted through said alignment holes in said wafer interconnect stacks, said coolant tubes having coolant outlets mating with said coolant inlets of said chip carrier modules, said coolant tubes aligning said wafer interconnect stacks and said chip carrier modules; and means for pressurizing said package along the z-axis.

5. A three-dimensional microelectronic package according to claim 4, wherein:

said chip carrier modules have a square footprint and chamfered corners; and said coolant tubes have a square cross-section and are arranged in a matrix so that four coolant tubes abut respective ones of the chamfered corners of each said chip carrier module.

6. A three-dimensional microelectronic package according to claim 5, wherein:

each said wafer interconnect stack comprises a stack of wafers having a matrix of conductive columns extending in the direction of the z-axis and wirings in the plane of the wafers providing interconnected between said conductive columns; and said means for pressurizing provides pressure along a column of aligned segments.

7. A three-dimensional microelectronic package according to claim 4, further comprising an input/output wafer to provide electrical interconnections with said conductive segments.

8. A three-dimensional microelectronic package according to claim 7, wherein said input/output wafer provides electrical power to and data and control signals to and from said semiconductor chips via said conductive segments.

9. A three-dimensional microelectronic package according to claim 4, wherein each said wafer interconnect stack comprises a stack of wafers having a matrix of conductive columns in the direction of the z-axis and wirings in the plane of the wafers providing interconnections between said columns.

10. A three-dimensional microelectronic package according to claim 9, wherein said wafers in each said wafer interconnect stack include plural button connect wafers and x-y interconnect wafers provided between adjacent button connect wafers.

11. A three-dimensional microelectronic package according to claim 4, wherein:

said chip carrier modules have connector pads;

said wafer interconnect stacks have connector buttons; and said connector pads are electrically connected to said connector buttons.

12. A three-dimensional package for semiconductor chips, comprising:

a plurality of wafer interconnect stacks, each said wafer interconnect stack including a plurality of layers, and a plurality of conductive segments formed in each layer;

a plurality of layers of chip carrier modules, said layers of chip carrier modules alternating with corresponding ones of said plurality of wafer interconnect stacks, each chip carrier module having at least one via aligned with a corresponding one of said segments, each chip carrier module housing a semiconductor chip in a coolant cavity, sealing the semiconductor chip from the coolant, providing a thermal contact between the semiconductor chip and the coolant, and electrically interconnecting the chip with said at least one via;

coolant tubes extending through said plurality of wafer interconnect stacks and providing private coolant to said coolant cavities of said chip carrier modules; and means for providing pressure along columns of aligned segments and vias.

13. A three-dimensional package according to claim 12, wherein each said wafer interconnect stack comprises signal traces provided on selected layers for providing electrical interconnections between selected ones of said segments.

14. A three-dimensional package according to claim 12, wherein:

each layer is formed of a material having a high time-dependent deformation factor; and each segment is formed of a conductive material having a low time-dependent deformation factor.

15. A three-dimensional package according to claim 12, wherein each said wafer interconnect stack comprises:
- a plurality of signal wafers, each signal wafer being formed of a material having a high time-dependent deformation factor;
- signal traces provided on said signal wafers;
- a plurality of ground wafers provided between respective ones of said signal wafers, each said ground wafer including first and second conductive layers provided on a support layers having a high time-dependent deformation factor;
- a plurality of segments formed in each signal and ground wafer, each segment comprising a conductive material having a low time-dependent deformation factor; and interrupt means for selectively interrupting said segments.

16. A three-dimensional package for semiconductor chips, comprising:
- a plurality of flexible wafers arranged in a wafer interconnect stack, one of said flexible wafers defining the x-y plane of a three dimensional coordinate system, each said flexible wafer having segments providing z-axis electrical interconnections, wirings providing electrical interconnections between selected ones of said segments, and a alignment holes;
- a plurality of chip carrier modules, each chip carrier module comprising:
  - a chip carrier coupon for supporting a semiconductor chip and having vias,
  - means for electrically interconnecting said semiconductor chips and said vias of said chip carrier coupon,
  - means for providing a sealed environment for the semiconductor chip,
  - an annular spacer coupon provided on said chip carrier coupon and surrounding said semiconductor chip, said spacer coupon having a coolant passage, and
  - a cover provided on said annular spacer coupon and having vias, said cover establishing a cavity between said chip carrier coupon and said cover and within said annular spacer coupon, said semiconductor chip being provided in said cavity;
- coolant tube extending through said plurality of flexible wafers, each said coolant tubes having a coolant outlet aligned with the coolant passage of said annular spacer coupon of a chip coupon; and
- means for pressurizing said package along the z-axis so that said segments and said vias form electrically conductive columns.

* * * * *

UNITED STATES PATENT AND TRADEMARK OFFICE
CERTIFICATE OF CORRECTION

PATENT NO. : 5,270,571
DATED : December 14, 1993
INVENTOR(S) : Howard L. Parks

It is certified that error appears in the above-indentified patent and that said Letters Patent is hereby corrected as shown below:

Column 12, line 6 (claim 6) "...wafers providing interconnected"
--wafers providing interconnections--.

Column 14, line 1(claim 16) " segements, and alignment holes"
-- segments, and alignment holes --.

Signed and Sealed this

Third Day of May, 1994

Attest:

BRUCE LEHMAN

Attesting Officer    Commissioner of Patents and Trademarks